United States Patent
Cheng et al.

(10) Patent No.: US 12,361,993 B2
(45) Date of Patent: Jul. 15, 2025

(54) MEMORY CHIP AND OPERATING METHOD THEREOF

(71) Applicant: AU Optronics Corporation, Hsin-Chu (TW)

(72) Inventors: Hsiang-Chi Cheng, Hsin-Chu (TW); Shyh-Bin Kuo, Hsin-Chu (TW); Yi-Cheng Lai, Hsin-Chu (TW); Chung-Hung Chen, Hsin-Chu (TW); Shih-Hsien Yang, Hsin-Chu (TW); Yu-Chih Wang, Hsin-Chu (TW); Kuo-Hsiang Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 18/635,049

(22) Filed: Apr. 15, 2024

(65) Prior Publication Data
US 2024/0265956 A1    Aug. 8, 2024

Related U.S. Application Data

(62) Division of application No. 17/746,477, filed on May 17, 2022, now Pat. No. 11,996,165.

(30) Foreign Application Priority Data
Nov. 18, 2021   (TW) ................................. 110143053

(51) Int. Cl.
*G11C 8/10*     (2006.01)
*G11C 8/08*     (2006.01)
*G11C 8/18*     (2006.01)

(52) U.S. Cl.
CPC .................. *G11C 8/10* (2013.01); *G11C 8/08* (2013.01); *G11C 8/18* (2013.01)

(58) Field of Classification Search
CPC ................ G11C 8/10; G11C 8/08; G11C 8/18
USPC ..................................................... 365/230.06
See application file for complete search history.

(56) References Cited

U.S. PATENT DOCUMENTS

| 4,301,535 A | 11/1981 | McKenny |
| 4,447,893 A | 5/1984 | Murakami |
| 6,870,752 B2 | 3/2005 | Chen |
| 7,738,305 B2 | 6/2010 | Lehmann |
| 2005/0207229 A1* | 9/2005 | Takeuchi ........... G11C 16/0483 365/185.25 |
| 2014/0347933 A1 | 11/2014 | Lee |

(Continued)

FOREIGN PATENT DOCUMENTS

TW    I742728 B    10/2021

*Primary Examiner* — Anthan Tran
(74) *Attorney, Agent, or Firm* — WPAT, PC

(57) ABSTRACT

A memory chip includes a first decoding device and a memory device. The first decoding device is configured to generate multiple word line signals. The memory device is configured to generate a third data signal based on a first data signal and a second data signal. The memory device includes a first memory circuit and a second memory circuit. The first memory circuit is configured to generate the first data signal at a first node according to the word line signals during a first period. The second memory circuit is configured to generate the second data signal at a second node different from the first node according to the word line signals during a second period after the first period. A method of operating a memory chip is also disclosed herein.

11 Claims, 11 Drawing Sheets

(56) References Cited

U.S. PATENT DOCUMENTS

| | | | |
|---|---|---|---|
| 2015/0070980 A1* | 3/2015 | Iwata | H10N 50/80 |
| | | | 365/158 |
| 2017/0011799 A1 | 1/2017 | Lee et al. | |
| 2018/0040377 A1 | 2/2018 | Sakui | |

* cited by examiner

MEMORY CHIP AND OPERATING METHOD THEREOF

CROSS-REFERENCE TO RELATED APPLICATION

This application is a divisional application of U.S. application Ser. No. 17/746,477, filed on May 17, 2022, which claims priority to Taiwan application Serial Number 110143053, filed Nov. 18, 2021, which is herein incorporated by reference in its entirety.

BACKGROUND

Technical Field

The present disclosure relates to a memory technology. More particularly, the present disclosure relates to a memory chip and a method of operating a memory chip.

Description of Related Art

A near field communication chip includes a memory device for storing data. The memory device may be constructed by thin film transistors (TFT). However, resistances between sources and drains of the TFT are larger, and corresponding mobility is low. The uniformity of the TFT is poor and is not suitable for designing amplifiers. Thus, techniques associated with the development for designing memory circuit structures suitable for TFT elements are important issues in the field.

SUMMARY

The present disclosure provides a memory chip. The memory chip includes a first encoding device and a memory device. The first encoding device is configured to generate a plurality of word line signals. The memory device is configured to generate a third data signal according to a first data signal and a second data signal. The memory device includes a first memory circuit and a second memory circuit. The first memory circuit is configured to generate the first data signal according to the plurality of word line signals at a first node during a first period. The second memory circuit is configured to generate the second data signal according to the plurality of word line signals at a second node different from the first node during a second period after the first period.

The present disclosure provides a memory chip. The memory chip includes a memory device. The memory device includes a first memory circuit, a first controlling circuit, a second memory circuit and a second controlling circuit. The first memory circuit is configured to output a first data signal at a first node. The first controlling circuit includes a first switch, a second switch and a third switch. A control terminal of the first switch is configured to receive a first enable signal, and a first terminal of the first switch is coupled to the first node. A control terminal of the second switch is configured to receive a pulse signal, and a first terminal of the second switch is coupled to the first node. A control terminal of the third switch is configured to receive the first enable signal, and a first terminal of the third switch is coupled to a second terminal of the second switch. The second controlling circuit includes a fourth switch, a fifth switch and a sixth switch. A control terminal of the fourth switch is configured to receive a second enable signal, and a first terminal of the fourth switch is coupled to the second node. A control terminal of the fifth switch is configured to receive the pulse signal, and a first terminal of the fifth switch is coupled to the second node. A control terminal of the sixth switch is configured to receive the second enable signal, and a first terminal of the sixth switch is coupled to a second terminal of the fifth switch.

The present disclosure provides a method of operating a memory chip. The method includes: providing N word line signals and M bit line signals to each of a first memory circuit and a second memory circuit, for M and N are positive integers; storing first bits in the first memory circuit; storing second bits in the second memory circuit; generating a first data signal according to the first bits, the N word line signals and the M bit line signals, when the second memory circuit is deactivated; generating a second data signal according to the second bits, the N word line signals and the M bit line signals, when the second memory circuit is deactivated; and combining the first data signal and the second data signal. Each of a number of the first bits and a number of the second bits are M multiplied by N.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
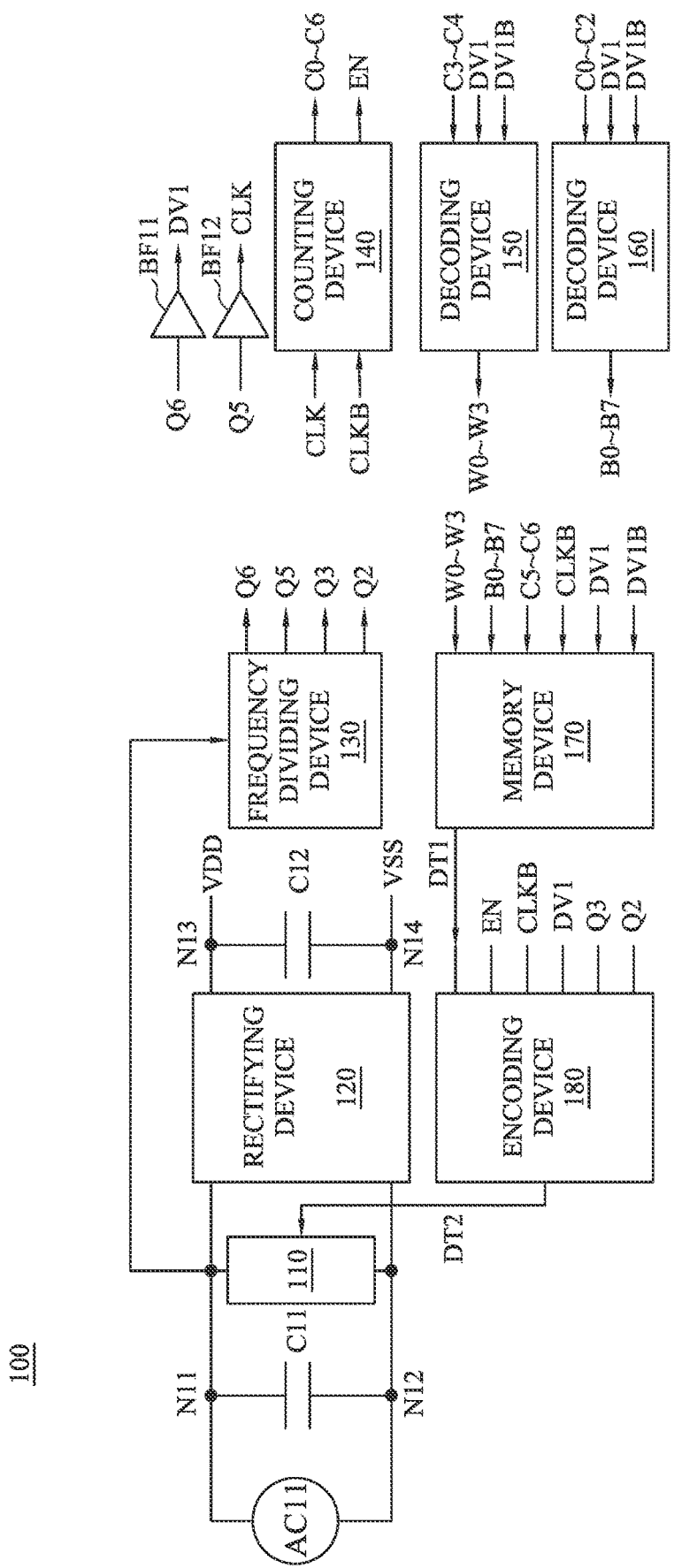
FIG. 1 is a schematic diagram of a memory chip illustrated according to one embodiment of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic diagram of a memory chip 100 illustrated according to one embodiment of this disclosure. In some embodiments, the memory chip 100 may implemented by a communication chip of near field communication. As illustratively shown in FIG. 1, the memory chip 100 includes a communication device 110, a rectifying device 120, a frequency dividing device 130, a counting device 140, decoding devices 150, 160, a memory device 170, an encoding device 180 and buffering devices BF11, BF12.

As illustratively shown in FIG. 1, the communication device 110 is configured to receive a voltage signal AC11 at nodes N11 and N12. The rectifying device 120 is configured to receive the voltage signal AC11 at the nodes N11 and N12, and configured to generate voltage signals VDD and VSS at nodes N13 and N14, respectively, according to the voltage signal AC11. In some embodiments, the rectifying device 120 is configured to transform the voltage signal AC11 into voltage signals VDD and VSS. In some embodiments, a voltage level of the voltage signal VDD is higher than a voltage level of the voltage signal VSS.

In some embodiments, the memory chip 100 further includes capacitors C11 and C12. As illustratively shown in FIG. 1, the capacitor C11 is configured to receive the voltage signal AC11 at the nodes N11 and N12. The capacitor C12 is configured to receive the voltage signal VDD at the node N13, and configured to receive the voltage signal VSS at the node N14. In some embodiments, a capacitance of the capacitor C11 is approximately thirty-nine pico-farad.

As illustratively shown in FIG. 1, the frequency dividing device 130 is configured to receive the voltage signal AC11 at the node N11, and configured to generate voltage signals Q2, Q3, Q5 and Q6 according to the voltage signal AC11. In some embodiments, the voltage signals Q2, Q3, Q5 and Q6 are implemented as clock signals. In some embodiments, a frequency of the voltage signal Q6 corresponds to a frequency of the voltage signal AC11, a frequency of the voltage signal Q5 is approximately a half of the frequency of the voltage signal Q6, a frequency of the voltage signal Q3 is approximately one-fourth of the frequency of the voltage signal Q5, a frequency of the voltage signal Q2 is approximately a half of the frequency of the voltage signal Q3.

In some embodiments, the buffering device BF11 is configured to generate a clock signal DV1 according to the voltage signal Q6, and the buffering device BF12 is configured to generate a clock signal CLK according to the voltage signal Q5. As illustratively shown in FIG. 1, an input terminal of the buffering device BF11 is configured to receive the voltage signal Q6, an output terminal of the buffering device BF11 is configured to output the clock signal CLK. In some embodiments, each of the buffering devices BF11 and BF12 includes one or more inverters coupled in series. In some embodiments, a frequency of the clock signal DV1 is substantially equal to the frequency of the voltage signal Q6, and a frequency of the clock signal CLK is substantially equal to the frequency of the voltage signal Q5. Further details of the clock signals CLK and DV1 are described below in embodiments associated with FIG. 4 to FIG. 11.

As illustratively shown in FIG. 1, the counting device 140 is configured to generate clock signals C0-C6 and an enable signal EN according to clock signals CLK and CLKB. In some embodiments, the clock signal CLKB is a complementary signal of the clock signal CLK. In some embodiments, a frequency of a signal is equal to a frequency of a complementary signal of the signal. In some embodiments, the counting device 140 is implemented by a non-synchronize counter. Further details of the clock signals C0-C6, CLKB and the enable signal EN are described below in embodiments associated with FIG. 4 to FIG. 11.

As illustratively shown in FIG. 1, the decoding device 150 is configured to generate word line signals W0-W3 according to the clock signals C3, C4, DV1 and DV1B. The decoding device 160 is configured to generate bit line signals B0-B7 according to the clock signals C0-C2, DV1 and DV1B. In some embodiments, the clock signal DV1B is a complementary signal of the clock signal DV1. In some embodiments, the decoding devices 150 and 160 are implemented by synchronize decoders. Further details of the word line signals W0-W3, the bit line signals B0-B7 and the clock signal DV1B are described below in embodiments associated with FIG. 4 to FIG. 11.

As illustratively shown in FIG. 1, the memory device 170 is configured to generate a data signal DT1 according to the word line signals W0-W3, the bit line signals B0-B7 and the clock signals DV1, DV1B, C5, C6, CLKB.

As illustratively shown in FIG. 1, the encoding device 180 is configured to output a data signal DT2 according to the data signal DT1, the enable signal EN and the clock signal DV1 and the voltage signal Q2, Q3. In some embodiments, the encoding device 180 is configured to encode the data signal DT1 according to ISO format, to generate the data signal DT2. In some embodiments, the encoding device 180 is configured to transmit the data signal DT2 to the communication device 110, and the communication device 110 is configured to transmit the data signal DT2 to external apparatuses and/or devices.

Figure 2:
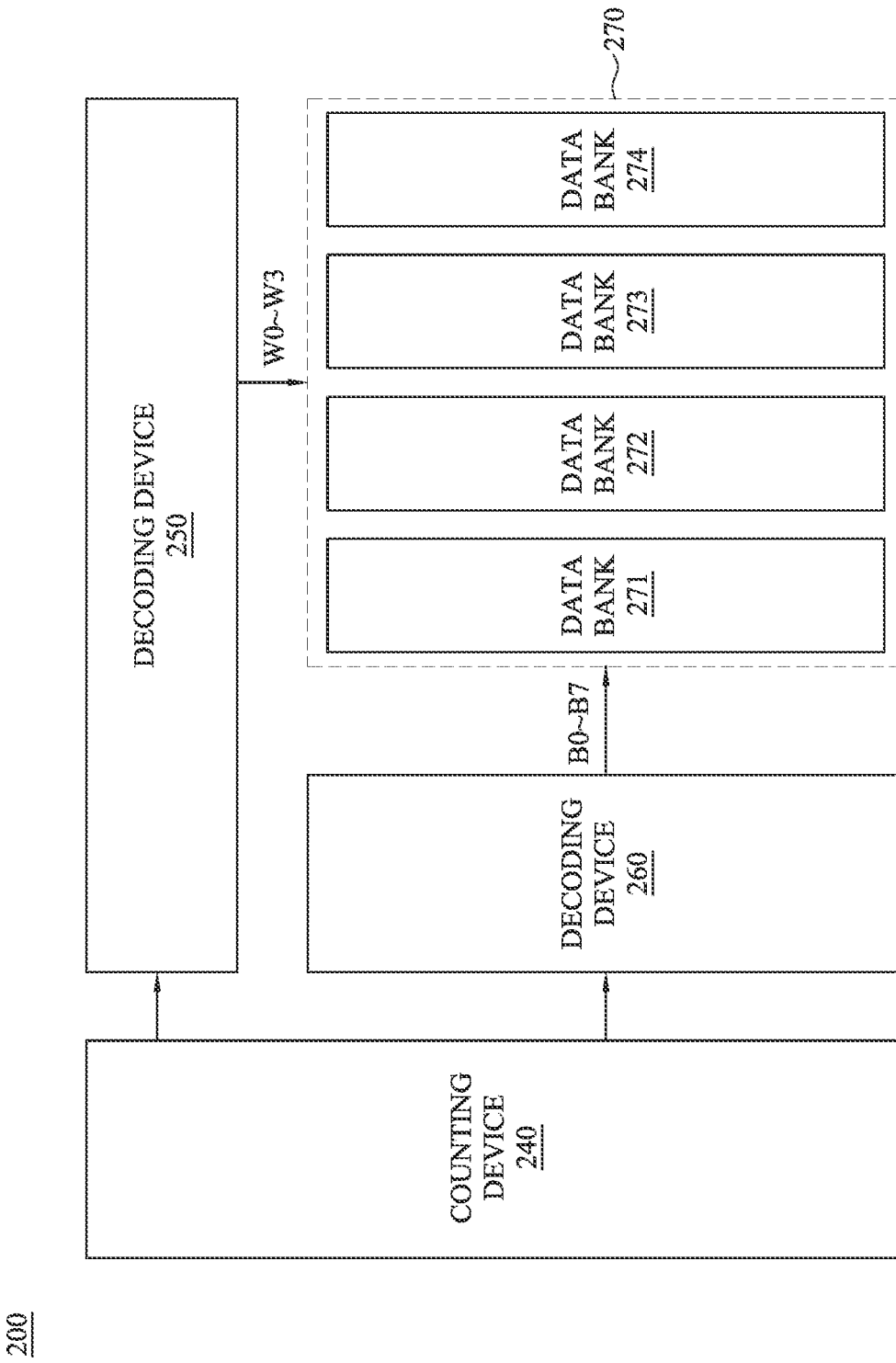
FIG. 2 is a schematic diagram of a memory chip illustrated according to one embodiment of this disclosure.

FIG. 2 is a schematic diagram of a memory chip 200 illustrated according to one embodiment of this disclosure. As illustratively shown in FIG. 2, the memory chip 200 includes a counting device 240, decoding devices 250, 260 and a memory device 270. Referring to FIG. 1 and FIG. 2, the memory chip 200 is an embodiment of the memory chip 100. The counting device 240, the decoding devices 250, 260 and the memory device 270 correspond to the counting device 140, the decoding devices 150, 160 and the memory device 170, respectively. Therefore, some descriptions are not repeated for brevity. In some embodiments, the memory device further includes various devices correspond to the communication device 110, the rectifying device 120, the frequency dividing device 130, the encoding device 180 and the buffering devices BF11, BF12.

In some embodiments, the counting device 240 is configured to provide various signals, such as the clock signals C3-C4 shown in FIG. 1, to the decoding device 250, and configured to provide various signals, such as the clock signals C0-C2 shown in FIG. 1, to the decoding device 260. The decoding device 250 is configured to generate the word line signals W0-W3. The decoding device 260 is configured to generate the bit line signals B0-B7. The memory device 270 is configured to operate according to the word line signals W0-W3 and the bit line signals B0-B7.

In some embodiments, the memory device 270 includes memory circuits 271-274. In some embodiments, each of the memory circuits 271-274 is configured to operate synchronously according to the word line signals W0-W3 and the bit line signals B0-B7. In some embodiments, each of the memory circuits 271-274 is configured to store thirty-two bits of data, in which the number of the thirty-two bits corresponds to the number of the word line signals W0-W3 multiplying the number of the bit line signals B0-B7. In the embodiments described above, the memory device 270 is configured to store one hundred and twenty-eight bits of data. In some embodiments, each of the memory circuits 271-274 is implemented by a dynamic programmable read only memory. In some embodiments, each of the memory circuits 271-274 is referred to as a data bank.

In various embodiments, the memory device 270 may include various numbers of memory circuit, and the decoding device 250 is configured to generate word line signals with corresponding numbers.

In some approaches, a memory device only includes one memory circuit. An encoding device need to generate a large amount of word line signals to perform non-synchronize controlling to the memory circuit. As a result, the decoding device and a counting device configured to control the decoding device occupy a larger area, and may generate a short-circuit current when phases of the word line signal are overlapped.

Compared to the above approaches, in some embodiments of the present disclosure, the decoding device 250 performs synchronize controlling to the memory circuits 271-274 by the same word line signals W0-W3, such that the decoding device 250 and the counting device 240 occupy a smaller area, and short-circuit currents are reduced.

Figure 3:
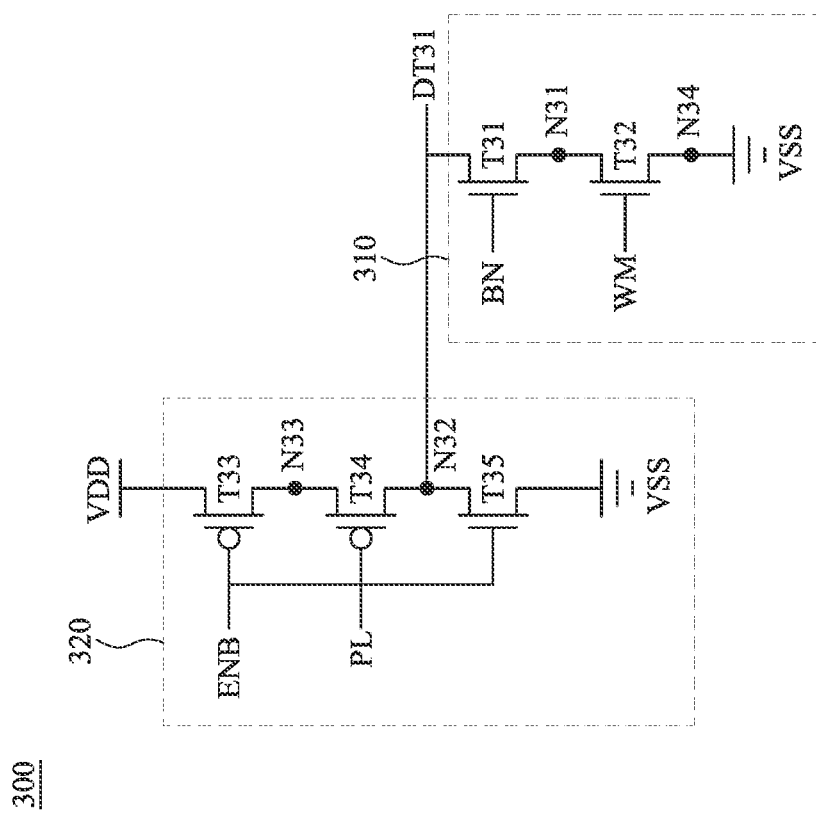
FIG. 3 is a schematic diagram of a memory device illustrated according to one embodiment of this disclosure.

FIG. 3 is a schematic diagram of a memory device 300 illustrated according to one embodiment of this disclosure. As illustratively shown in FIG. 3, the memory device 300 includes a memory circuit 310 and a controlling circuit 320. Referring to FIG. 2 and FIG. 3, the memory device 300 is an embodiment of the memory device 270. Each of the memory circuits 271-274 may be implemented as the memory circuit 310. Therefore, some descriptions are not repeated for brevity.

As illustratively shown in FIG. 3, the memory circuit 310 and the controlling circuit 320 are coupled to each other a node N32. In some embodiments, the controlling circuit 320 is configured to adjust a voltage level of the node N32 according to an enable signal ENB and the pulse signal PL, to control the memory circuit 310. The memory circuit 310 is configured to be activated or deactivated according to the voltage level of the node N32, and is configured to generate a data signal DT31 according to a word line signal WM and a bit line signal BN when being activated. It is noted that N and M of the word line signal WM and the bit line signal BN are integers larger than or equal to zero. Referring to FIG. 3 and FIG. 1, the data signal DT31 is an embodiment of the data signal DT1, the word line signal WM corresponds to the word line signals W0-W3, and the bit line signal BN corresponds to the bit line signals B0-B7. In some embodiments, the enable signal ENB is a complementary signal of the enable signal EN.

In some embodiments, the memory circuit 310 includes switches T31 and T32. As illustratively shown in FIG. 3, a control terminal of the switch T31 is configured to receive the bit line signal BN, a terminal of the switch T31 is coupled to the node N32, another terminal of the switch T31 is coupled to a node N31. A control terminal of the switch T32 is configured to receive the word line signal WM, a terminal of the switch T32 is coupled to the node N31, another terminal of the switch T32 is configured to receive the voltage signal VSS or a ground voltage signal.

In some embodiments, the controlling circuit 320 includes switches T33-T35. As illustratively shown in FIG. 3, a control terminal of the switch T33 is configured to receive the enable signal ENB, a terminal of the switch T33 is coupled to a node N33, another terminal of the switch T33 is configured to receive the voltage signal VDD or other voltage signals having an enable voltage level. A control terminal of the switch T34 is configured to receive the pulse signal PL, a terminal of the switch T34 is coupled to the node N33, another terminal of the switch T34 is coupled to the node N32. A control terminal of the switch T35 is configured to receive the enable signal ENB, a terminal of the switch T35 is coupled to the node N32, another terminal of the switch T35 is configured to receive the voltage signal VSS or the ground voltage signal.

In some embodiments, a type of the switches T31, T32 and T35 is different from a type of the switches T33 and T34. For example, the switches T31, T32 and T35 are implemented by N-type thin film transistors (NTFT), and the switches T33 and T34 are implemented by P-type thin film transistors (PTFT).

In some embodiments, when the switch T33 is turned on according to the enable signal ENB, the switch T35 is turned off according to the enable signal ENB. When the switch T33 is turned off according to the enable signal ENB, the switch T35 is turned on according to the enable signal ENB.

In some embodiments, the switch T35 is configured to be turned on to pull the voltage level of the node N32 to a voltage level of the voltage signal VSS. When the node N32 has the voltage level of the voltage signal VSS, a voltage difference between the nodes N32 and N34 is substantially equal to zero, and the memory circuit 310 does not generate the data signal DT31. Alternatively stated, the switch T35 is configured to be turned on to deactivate the memory circuit 310.

In some embodiments, the switch T33 is configured to be turned on to pull the voltage level of the node N33 to a voltage level of the voltage signal VDD. When the node N33 have the voltage level of the voltage signal VDD, the switch T34 may be turned to charge the node N32, such that the memory circuit 310 may generate the data signal DT31 according to the word line signal WM and the bit line signal BN. Alternatively stated, the switch T33 is configured to be turned on to activate the memory circuit 310.

In some approaches, a node for outputting data signals in a memory device needs to be charged frequently, and a control circuit needs to provide a larger current, such that the required area is larger and leakage currents tend to be generated.

Compared to the above approaches, in some embodiments of the present disclosure, the controlling circuit 320 is configured to deactivate or activate the memory circuit 310 according to the enable signal ENB. The memory circuit 310 does not have a current passing through when being deactivated, and the memory circuit 310 has a smaller current passing through when being activated. The controlling circuit 320 is configured to charge the node N32 at proper moments according to the pulse signal PL. As a result, the required area of the memory device 300 is smaller and leakage currents are reduced. Accordingly, a signal quality of the data signal DT31 is better.

Figure 4:
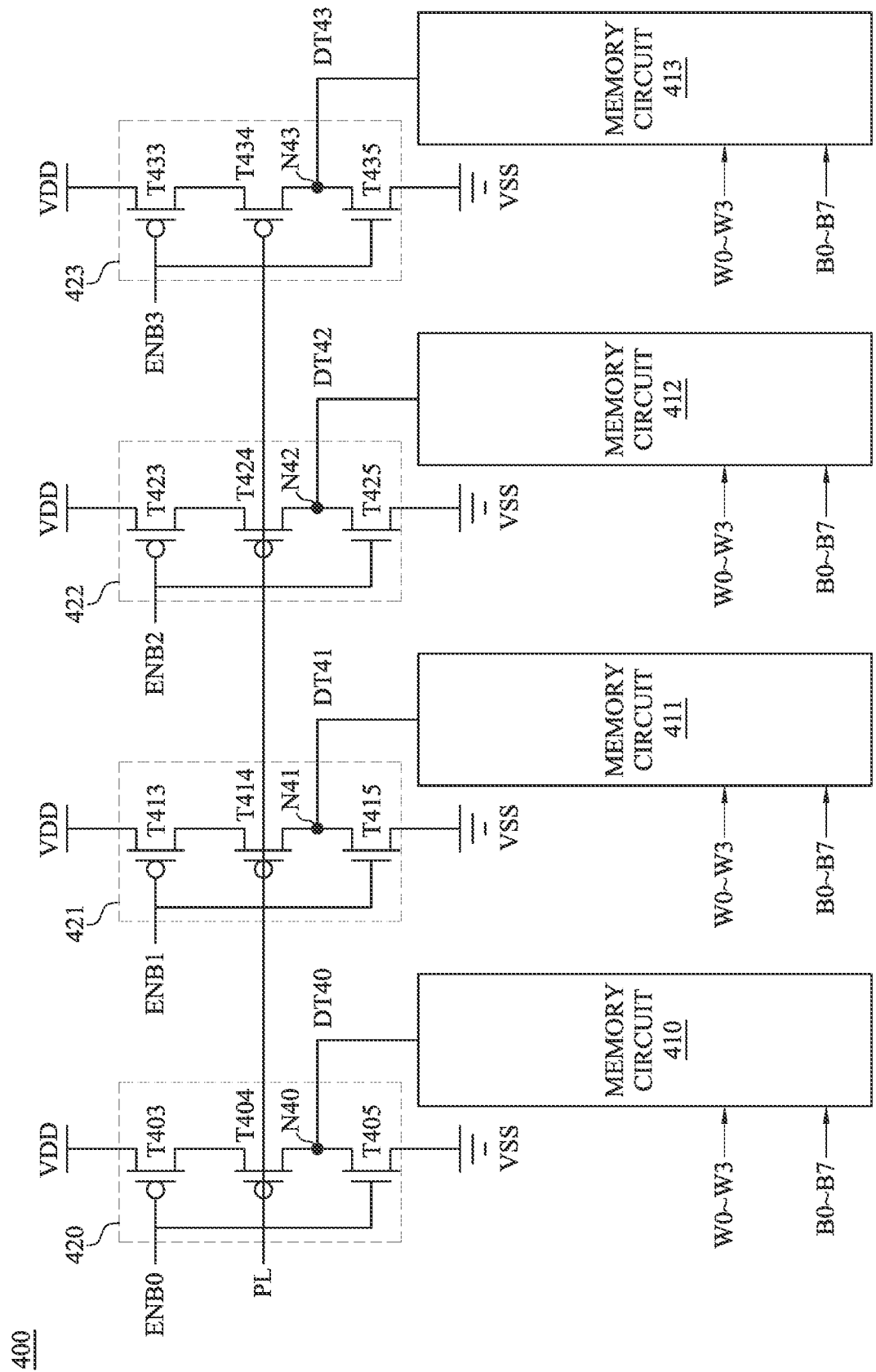
FIG. 4 is a schematic diagram of a memory device illustrated according to one embodiment of this disclosure.

FIG. 4 is a schematic diagram of a memory device 400 illustrated according to one embodiment of this disclosure. Referring to FIG. 1 and FIG. 4, the memory device 400 is an embodiment of the memory device 170. As illustratively shown in FIG. 4, the memory device 400 includes memory circuits 410-413 and controlling circuits 420-423. Referring to FIG. 2 and FIG. 4, the memory device 400 is an embodiment of the memory device 270. The memory circuits 410-413 correspond to the memory circuits 271-274, respectively. Therefore, some descriptions are not repeated for brevity.

As illustratively shown in FIG. 4, the memory circuit 410 is coupled to the controlling circuit 420 at a node N40, the memory circuit 411 is coupled to the controlling circuit 421 at a node N41, the memory circuit 412 is coupled to the controlling circuit 422 at a node N42, the memory circuit 413 is coupled to the controlling circuit 423 at a node N43. In some embodiments, the nodes N40-N43 are electrically isolated from each other.

In some embodiments, the controlling circuit 420 is configured to control the memory circuit 410 according to an enable signal ENB0 and the pulse signal PL, such that the memory circuit 410 generates a data signal DT40 at the node N40. In some embodiments, the controlling circuit 420 includes switches T403-T405. Referring to FIG. 3 and FIG. 4, configurations of the switches T403-T405 are similar with the configurations of the switches T33-T35, and operations of the controlling circuit 420 controlling the memory circuit 410 generating the data signal DT40 according to the enable signal ENB0 and the pulse signal PL are similar with the operations of the controlling circuit 320 controlling the memory circuit 310 generating the data signal DT31 according to the enable signal ENB and the pulse signal PL. Therefore, some descriptions are not repeated for brevity.

In some embodiments, the controlling circuit 421 is configured to control the memory circuit 411 according to an enable signal ENB1 and the pulse signal PL, such that the memory circuit 411 generates a data signal DT41 at the node N41. In some embodiments, the controlling circuit 421 includes switches T413-T415. Referring to FIG. 3 and FIG. 4, configurations of the switches T413-T415 are similar with the configurations of the switches T33-T35, and operations of the controlling circuit 421 controlling the memory circuit 411 generating the data signal DT41 according to the enable signal ENB1 and the pulse signal PL are similar with the operations of the controlling circuit 320 controlling the memory circuit 310 generating the data signal DT31 according to the enable signal ENB and the pulse signal PL. Therefore, some descriptions are not repeated for brevity.

In some embodiments, the controlling circuit 422 is configured to control the memory circuit 412 according to an enable signal ENB2 and the pulse signal PL, such that the memory circuit 412 generates a data signal DT42 at the node N42. In some embodiments, the controlling circuit 422 includes switches T423-T425. Referring to FIG. 3 and FIG. 4, configurations of the switches T423-T425 are similar with the configurations of the switches T33-T35, and operations of the controlling circuit 422 controlling the memory circuit 412 generating the data signal DT42 according to the enable signal ENB2 and the pulse signal PL are similar with the operations of the controlling circuit 320 controlling the memory circuit 310 generating the data signal DT31 according to the enable signal ENB and the pulse signal PL. Therefore, some descriptions are not repeated for brevity.

In some embodiments, the controlling circuit 423 is configured to control the memory circuit 413 according to an enable signal ENB3 and the pulse signal PL, such that the memory circuit 413 generates a data signal DT43 at the node N43. In some embodiments, the controlling circuit 423 includes switches T433-T435. Referring to FIG. 3 and FIG. 4, configurations of the switches T433-T435 are similar with the configurations of the switches T33-T35, and operations of the controlling circuit 423 controlling the memory circuit 413 generating the data signal DT43 according to the enable signal ENB3 and the pulse signal PL are similar with the operations of the controlling circuit 320 controlling the memory circuit 310 generating the data signal DT31 according to the enable signal ENB and the pulse signal PL. Therefore, some descriptions are not repeated for brevity.

Referring to FIG. 2 and FIG. 4, in some embodiments, each of the memory circuits 410-413 is configured to generate a corresponding one of the data signals DT40-DT43 according to the word line signals W0-W4. In some embodiments, each of the memory circuits 410-413 is configured to generate the corresponding one of the data signals DT40-DT43 according to the bit line signals B0-B7.

In some embodiments, a type of the switches T403, T404, T413, T414, T423, T424, T433 and T434 is different from a type of the switches T405, T415, T425 and T435. For example, the switches T403, T404, T413, T414, T423, T424, T433 and T434 are implemented by PTFT, and the switches T405, T415, T425 and T435 are implemented by NTFT.

Figure 5:
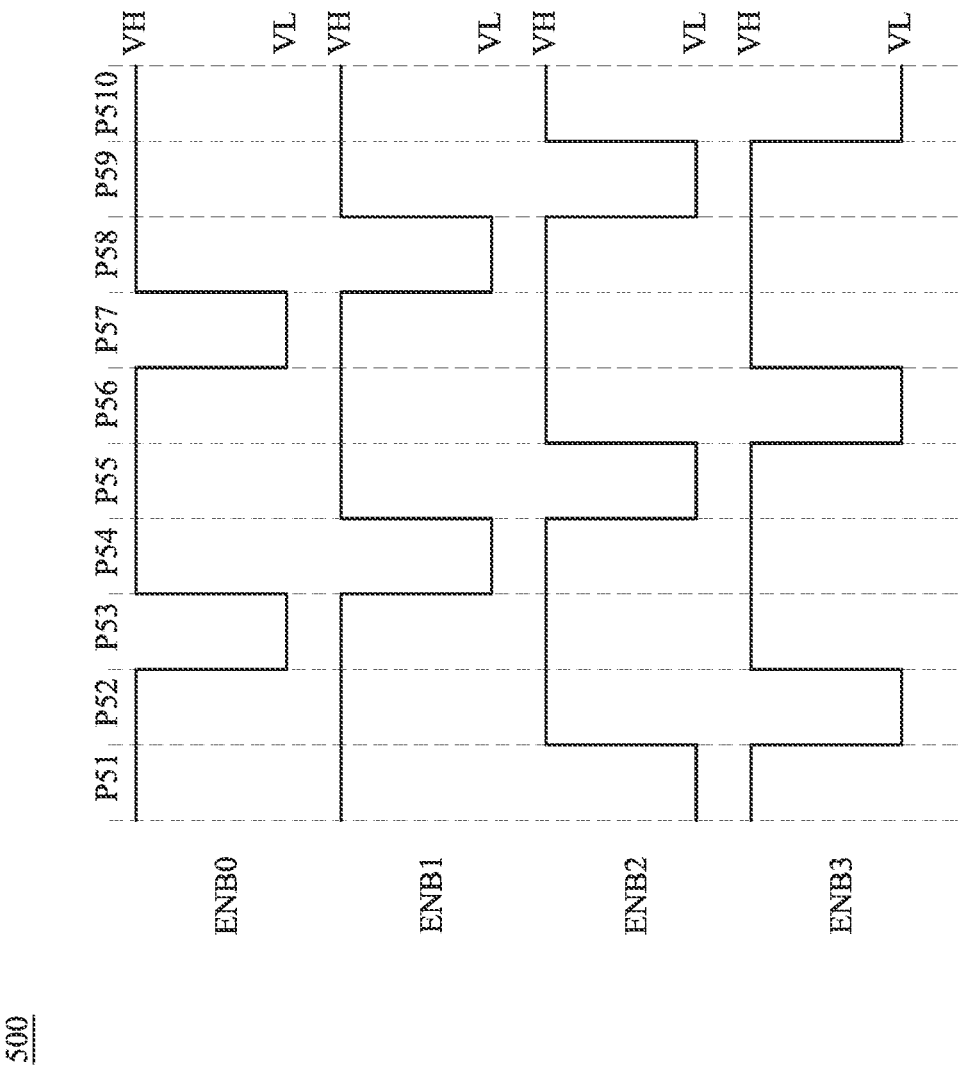
FIG. 5 is a timing diagram of a memory device performing operations according to enable signals, illustrated according to one embodiment of this disclosure.
Figure 6:
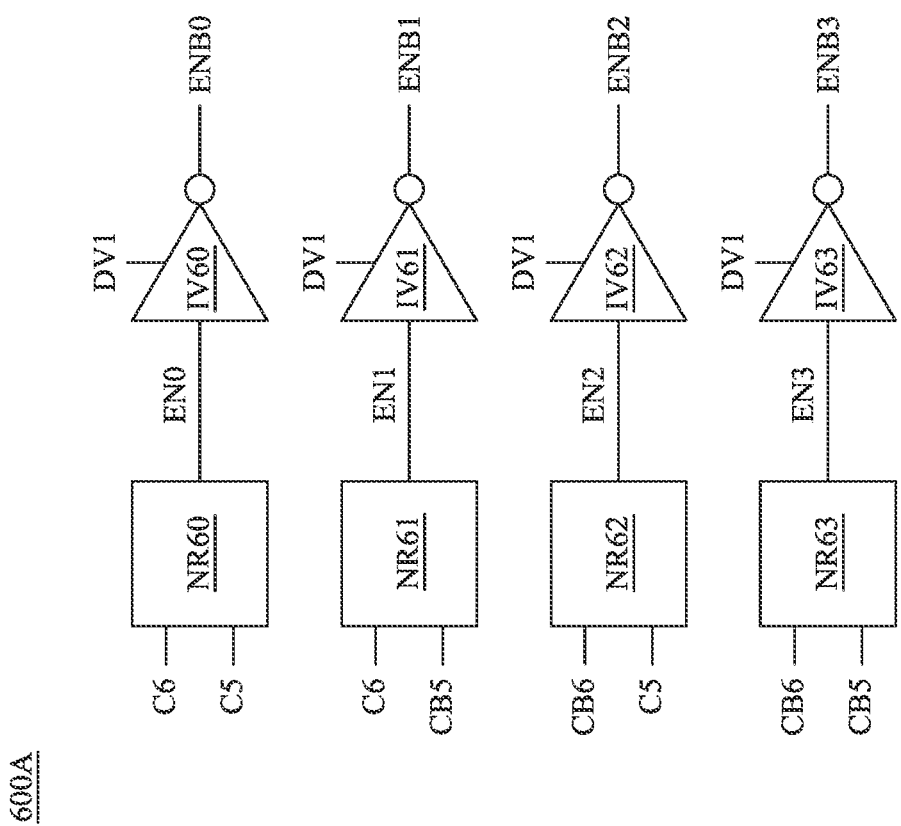
FIG. 6A is a schematic diagram of a logic circuit illustrated according to one embodiment of this disclosure.
FIG. 6B is a schematic diagram of a logic circuit illustrated according to one embodiment of this disclosure.

FIG. 5 is a timing diagram 500 of the memory device 400 shown in FIG. 4 performing operations according to the enable signals ENB0-ENB3, illustrated according to one embodiment of this disclosure. As illustratively shown in FIG. 5, the timing diagram 500 includes periods P51-P510 arranged continuously in order.

As illustratively shown in FIG. 5, during the period P53, the enable signal ENB0 has a voltage level VL, and the enable signals ENB1-ENB3 have a voltage level VH. Referring to FIG. 5 and FIG. 4, during the period P53, in response to the enable signal ENB0 having the voltage level VL, the switch T403 is turned on and the switch T405 is turned off, such that the memory circuit 410 generates the data signal DT40. During the period P53, in response to the enable signals ENB1-ENB3 having the voltage level VH, the switches T415, T425 and T435 are turned on and the switches T413, T423 and T433 are turned off, such that the memory circuits 411-413 are deactivated. In some embodiments, each of the memory circuits 410-413 does not generate a corresponding one of the data signals DT40-DT43 when being deactivated.

As illustratively shown in FIG. 5, during the period P54, the enable signal ENB1 has the voltage level VL, and the enable signals ENB0, ENB2 and ENB3 have the voltage level VH. Referring to FIG. 5 and FIG. 4, during the period P54, in response to the enable signal ENB1 having the voltage level VL, the switch T413 is turned on and the switch T415 is turned off, such that the memory circuit 411 generates the data signal DT41. During the period P54, in response to the enable signals ENB0, ENB2 and ENB3 having the voltage level VH, the switches T405, T425 and T435 are turned on and the switches T403, T423 and T433 are turned off, such that the memory circuits 410, 412 and 413 are deactivated.

As illustratively shown in FIG. 5, during the period P55, the enable signal ENB2 has the voltage level VL, and the enable signals ENB0, ENB1 and ENB3 have the voltage level VH. Referring to FIG. 5 and FIG. 4, during the period P55, in response to the enable signal ENB2 having the voltage level VL, the switch T423 is turned on and the switch T425 is turned off, such that the memory circuit 412 generates the data signal DT42. During the period P55, in response to the enable signals ENB0, ENB1 and ENB3 having the voltage level VH, the switches T405, T415 and T435 are turned on and the switches T403, T413 and T433 are turned off, such that the memory circuits 410, 411 and 413 are deactivated.

As illustratively shown in FIG. 5, during the period P56, the enable signal ENB3 has the voltage level VL, and the enable signals ENB0-ENB2 have the voltage level VH. Referring to FIG. 5 and FIG. 4, during the period P56, in response to the enable signal ENB3 having the voltage level VL, the switch T433 is turned on and the switch T435 is turned off, such that the memory circuit 413 generates the data signal DT43. During the period P56, in response to the enable signals ENB0-ENB2 having the voltage level VH, the switches T415, T425 and T405 are turned on and the switches T413, T423 and T403 are turned off, such that the memory circuits 410-412 are deactivated.

Referring to FIG. 2 to FIG. 5, in some embodiments, during the periods P53-P56, the memory circuits 410-413 are activated in order, and generates the data signals DT40-DT43 in order according to the same word line signals W0-W3 and the same bit line signals B0-B7 when being activated.

As illustratively shown in FIG. 5, operations of the periods P57-P510 are similar with the operations of the periods P53-P56, respectively, and operations of the periods P51-P52 are similar with the operations of the periods P55-P56, respectively. Therefore, some descriptions are not repeated for brevity.

FIG. 6A is a schematic diagram of a logic circuit 600A illustrated according to one embodiment of this disclosure. Referring to FIG. 4 and FIG. 6A, in some embodiments, the logic circuit 600A is included in the memory device 400. Referring to FIG. 1, FIG. 4 and FIG. 6A, in some embodiments, the logic circuit 600A is configured to generate the enable signals ENB0-ENB3 according to the clock signals C5 and C6.

In some embodiments, the logic circuit 600A includes logic elements NR60-NR63 and IV60-IV63. In some embodiments, each of the logic elements NR60-NR63 is implemented by a NOR logic gate, and each of the logic elements IV60-IV63 is implemented by an inverter. In some embodiments, the logic elements IV60-IV63 are configured to operate according to the clock signal DV1. In various embodiments, the logic elements NR60-NR63 and IV60-IV63 may be implemented by various types of logic elements.

As illustratively shown in FIG. 6A, two input terminals of the logic element NR60 are configured to receive the clock signals C5 and C6, respectively, and an output terminal of the logic element NR60 is configured to output an enable signal EN0. An input terminal of the logic element IV60 is configured to receive the enable signal EN0, and an output terminal of the logic element IV60 is configured to output the enable signal ENB0. In some embodiments, the enable signal EN0 is a complementary signal of the enable signal ENB0.

As illustratively shown in FIG. 6A, two input terminals of the logic element NR61 are configured to receive clock signals CB5 and C6, respectively, and an output terminal of the logic element NR61 is configured to output an enable signal EN1. An input terminal of the logic element IV61 is configured to receive the enable signal EN1, and an output terminal of the logic element IV61 is configured to output the enable signal ENB1. In some embodiments, the enable signal EN1 is a complementary signal of the enable signal ENB1, and the clock signal CB5 is a complementary signal of the clock signal C5.

As illustratively shown in FIG. 6A, two input terminals of the logic element NR62 are configured to receive clock signals C5 and CB6, respectively, and an output terminal of the logic element NR62 is configured to output an enable signal EN2. An input terminal of the logic element IV62 is configured to receive the enable signal EN2, and an output terminal of the logic element IV62 is configured to output the enable signal ENB2. In some embodiments, the enable signal EN2 is a complementary signal of the enable signal ENB2, and the clock signal CB6 is a complementary signal of the clock signal C6.

As illustratively shown in FIG. 6A, two input terminals of the logic element NR63 are configured to receive the clock signals CB5 and CB6, respectively, and an output terminal of the logic element NR63 is configured to output an enable signal EN3. An input terminal of the logic element IV63 is configured to receive the enable signal EN3, and an output terminal of the logic element IV63 is configured to output the enable signal ENB3. In some embodiments, the enable signal EN3 is a complementary signal of the enable signal ENB3.

FIG. 6B is a schematic diagram of a logic circuit 600B illustrated according to one embodiment of this disclosure. Referring to FIG. 4 and FIG. 6B, in some embodiments, the logic circuit 600B is included in the memory device 400.

Referring to FIG. 1, FIG. 4 and FIG. 6B, the logic circuit 600B is configured to generate the data signal DT1 according to the data signal DT40-DT43.

In some embodiments, the logic circuit 600A includes a logic element OR61. In some embodiments, the logic element OR61 is implemented by an OR logic gate. In various embodiments, the logic element OR61 may implemented by various types of logic elements.

As illustratively shown in FIG. 6B, the logic element OR61 is configured to receive the data signal DT40-DT43, and configured to perform an OR operation to the data signal DT40-DT43 to generate the data signal DT1. In some embodiments, the data signal DT1 includes information of the data signal DT40-DT43. For example, each of the data signal DT40-DT43 includes thirty-two bits of information, and the data signal DT1 includes corresponding one hundred and twenty-eight bits of information.

Figure 7:
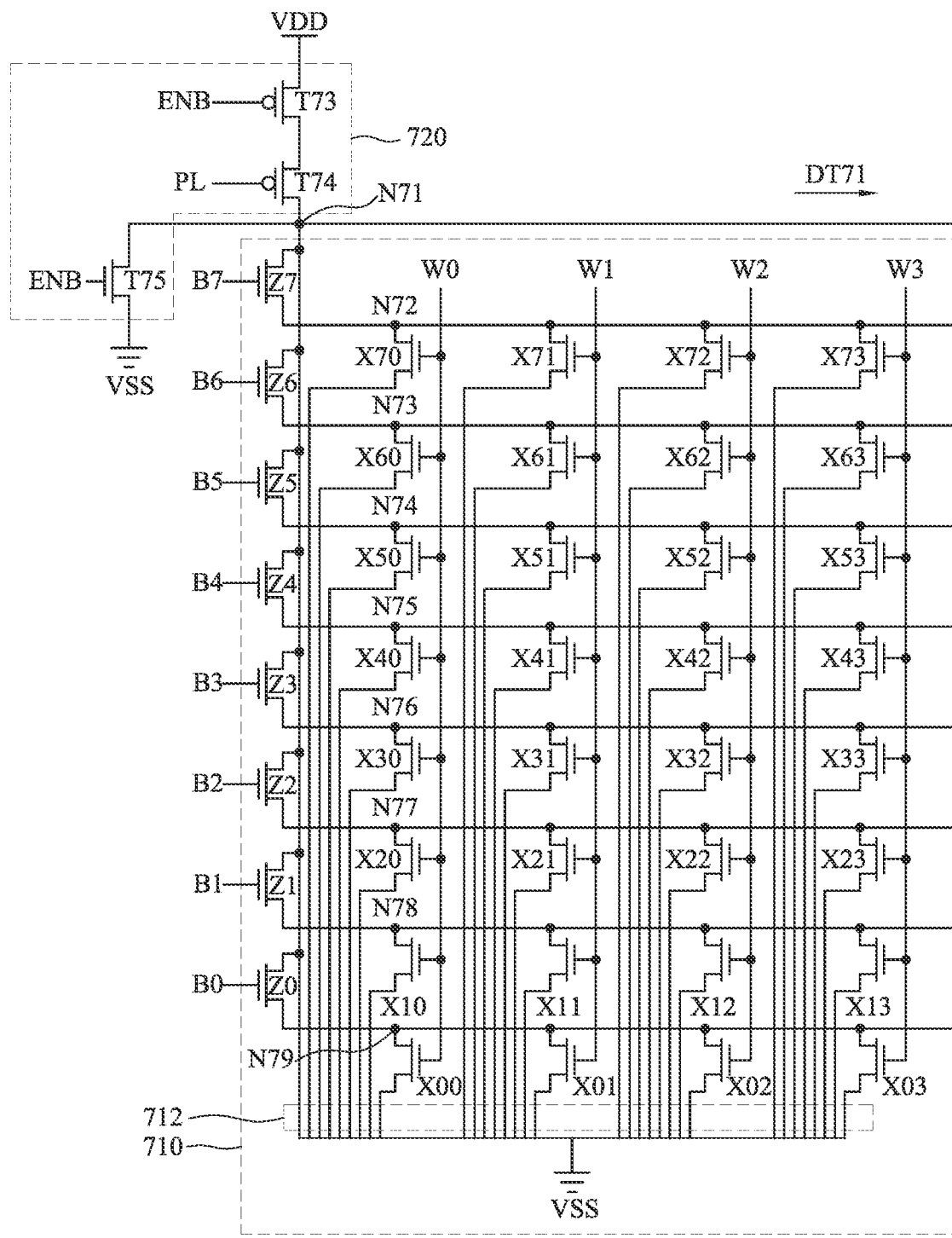
FIG. 7 is a schematic diagram of a memory device illustrated according to one embodiment of this disclosure.

FIG. 7 is a schematic diagram of a memory device 700 illustrated according to one embodiment of this disclosure. As illustratively shown in FIG. 7, the memory device 700 includes a memory circuit 710 and a controlling circuit 720. The controlling circuit 720 is configured to control the memory circuit 710, such that the memory circuit 710 generates a data signal DT71 at a node N71. Referring to FIG. 7 and FIG. 3, the memory device 700 is an embodiment of the memory device 300. Operations of the memory circuit 710 and the controlling circuit 720 generating the data signal DT71 correspond to the operations of the memory circuit 310 and the controlling circuit 320 generating the data signal DT31. Therefore, some descriptions are not repeated for brevity.

In some embodiments, the controlling circuit 720 includes switches T73-T75. In some embodiments, the switch T75 is implemented by a NTFT, and the switches T73 and T74 are implemented by a PTFT. The switches T73-T75 are configured to operate according to the enable signal ENB and the pulse signal PL. Referring to FIG. 7 and FIG. 3, configurations of the switches T73-T75 and operations of the switches T73-T75 according to the enable signal ENB and the pulse signal PL are similar with the configurations of the switches T33-T35 and operations of the switches T33-T35 according to the enable signal ENB and the pulse signal PL. Therefore, some descriptions are not repeated for brevity.

In some embodiments, the memory circuit 710 includes switches Z0-Z7, X00-X03, X10-X13, X20-X23, X30-X33, X40-X43, X50-X53, X60-X63 and X70-X73. Referring to FIG. 7 and FIG. 4, the memory circuit 710 is an embodiment of each of the memory circuits 410-413. In some embodiments, each of the memory circuits 410-413 has the configuration of the memory circuit 710. In the embodiments described above, operations of the memory circuits 410-413 generating the data signals DT40-DT43 are similar with operations of the memory circuit 710 generating the data signal DT71. In some embodiments, the switches Z0-Z7, X00-X03, X10-X13, X20-X23, X30-X33, X40-X43, X50-X53, X60-X63 and X70-X73 are implemented as NTFT.

As illustratively shown in FIG. 7, control terminals of the switches Z0-Z7 are configured to receive the bit line signals B0-B7, respectively. First terminals the switches Z0-Z7 are coupled to a node N71. Second terminals the switches Z0-Z7 are coupled to nodes N72-N79, respectively.

As illustratively shown in FIG. 7, control terminals of the switches X00, X10, X20, X30, X40, X50, X60 and X70 are configured to receive the word line signal W0, control terminals of the switches X01, X11, X21, X31, X41, X51, X61 and X71 are configured to receive the word line signal W1, control terminals of the switches X02, X12, X22, X32, X42, X52, X62 and X72 are configured to receive the word line signal W2, control terminals of the switches X03, X13, X23, X33, X43, X53, X63 and X73 are configured to receive the word line signal W3.

As illustratively shown in FIG. 7, first terminals of the switches X00-X03 are coupled to the node N79, first terminals of the switches X10-X13 are coupled to the node N78, first terminals of the switches X20-X23 are coupled to the node N77, first terminals of the switches X30-X33 are coupled to the node N76, first terminals of the switches X40-X43 are coupled to the node N75, first terminals of the switches X50-X53 are coupled to the node N74, first terminals of the switches X60-X63 are coupled to the node N73, first terminals of the switches X70-X73 are coupled to the node N72. Second terminals of the switches Z0-Z7, X00-X03, X10-X13, X20-X23, X30-X33, X40-X43, X50-X53, X60-X63 and X70-X73 are configured to receive the voltage signal VSS or the ground voltage.

In the embodiment shown in FIG. 7, the memory circuit 710 is configured to store thirty-two bits of data. Each of the switches X00-X03, X10-X13, X20-X23, X30-X33, X40-X43, X50-X53, X60-X63 and X70-X73 is configured to read one corresponding bit of data, to generate the data signal DT71 having thirty-two bits.

Referring to FIG. 7 and FIG. 3, for integers i and j larger than or equal to zero and smaller than or equal to seven, and a integer k larger than or equal to zero and smaller than or equal to three, configurations of the switches Zi and Xjk and operations of the switches Zi and Xjk generating the data signal DT71 according to the word line signals W0-W3 and the bit line signals B0-B7 are similar with the configurations of the switches T31 and T32 and operations of the switches T31 and T32 generating the data signal DT31 according to the word line signal WM and the bit line signal BN. Therefore, some descriptions are not repeated for brevity.

In some embodiments, the memory circuit 710 further includes a cutting area 712. As illustratively shown in FIG. 7, the cutting area 712 is located between the switches Z0-Z7, X00-X03, X10-X13, X20-X23, X30-X33, X40-X43, X50-X53, X60-X6, X70-X73 and a voltage source providing the voltage signal VSS. In some embodiments, the cutting area 712 includes bus lines configured to perform laser cutting.

Figure 8:
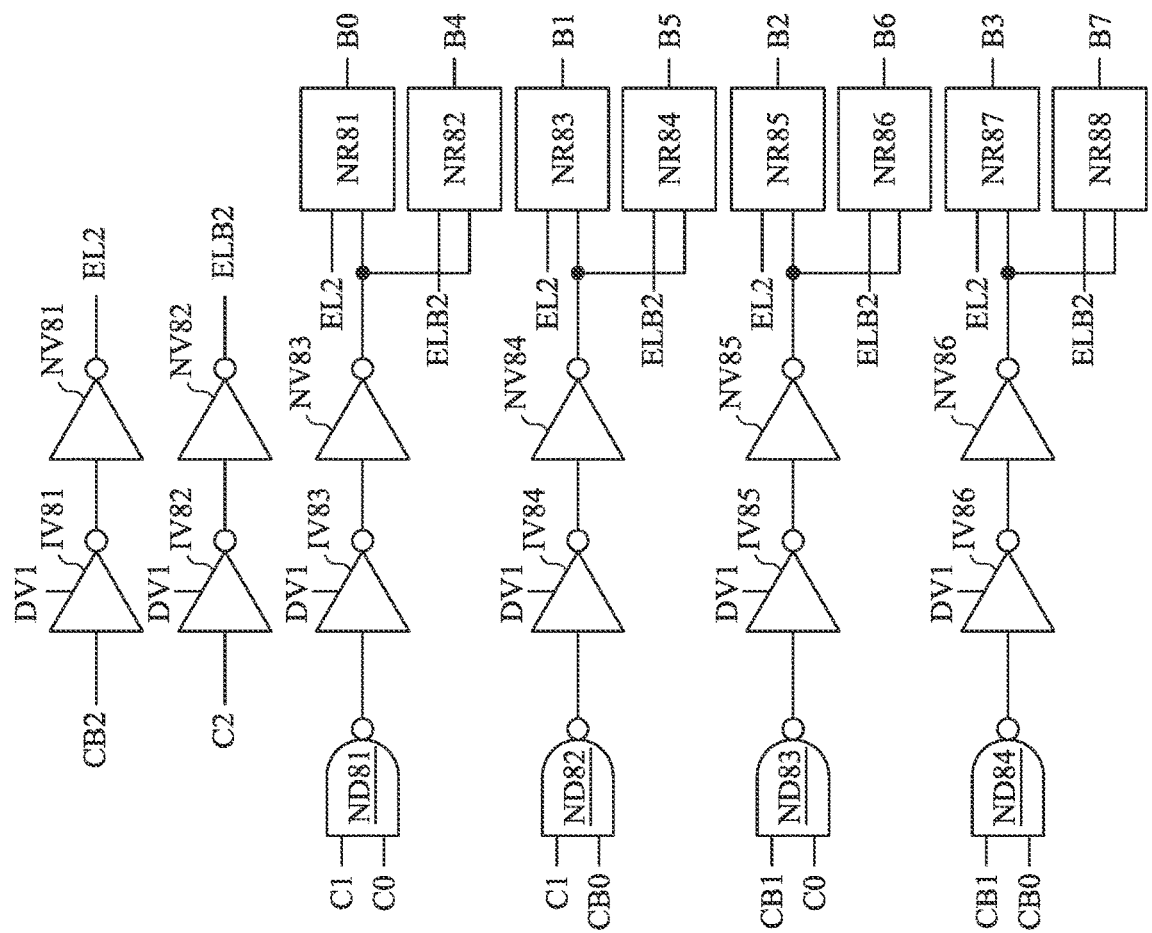
FIG. 8 is a schematic diagram of a logic circuit illustrated according to one embodiment of this disclosure.

FIG. 8 is a schematic diagram of a logic circuit 800 illustrated according to one embodiment of this disclosure. Referring to FIG. 1 and FIG. 8, in some embodiments, the logic circuit 800 is included in the decoding device 160. As illustratively shown in FIG. 8, the logic circuit 800 is configured to generate the bit line signals B0-B7 according to clock signals C0-C2 and CB0-CB2. In some embodiments, the clock signals CB0-CB2 are complementary signals of the clock signals C0-C2, respectively.

In some embodiments, the logic circuit 800 includes logic elements ND81-ND84, NR81-NR88, NV81-NV86 and IV81-IV86. In some embodiments, each of the logic elements ND81-ND84 is implemented by a NAND logic gate, each of the logic elements NR81-NR88 is implemented by a NOR logic gate, and each of the logic elements NV81-NV86 and IV81-IV86 is implemented by an inverter. In some embodiments, each of the logic elements IV81-IV86 is configured to operate according to the clock signal DV1.

As illustratively shown in FIG. 8, an input terminal of the logic element IV81 is configured to receive the clock signal CB2, and an output terminal of the logic element IV81 is coupled to an input terminal of the logic element NV81. An output terminal of the logic element NV81 is configured to output the enable signal EL2. An input terminal of the logic element IV82 is configured to receive the clock signal C2, and an output terminal of the logic element IV82 is coupled to an input terminal of the logic element NV82. An output terminal of the logic element NV82 is configured to output the enable signal ELB2.

As illustratively shown in FIG. 8, two input terminals of the logic element ND81 is configured to receive the clock signal C1 and C0, respectively, and an output terminal of the logic element ND81 is coupled to an input terminal of the logic element IV83. An output terminal of the logic element IV83 is coupled to an input terminal of the logic element NV83. An input terminal of the logic element NR81 is configured to receive the enable signal EL2, another input terminal of the logic element NR81 is coupled to an output terminal of the logic element NV83, and an output terminal of the logic element NR81 is configured to output the bit line signal B0. An input terminal of the logic element NR82 is configured to receive the enable signal ELB2, another input terminal of the logic element NR82 is coupled to the output terminal of the logic element NV83, and an output terminal of the logic element NR82 is configured to output the bit line signal B4.

As illustratively shown in FIG. 8, two input terminals of the logic element ND82 is configured to receive the clock signal C1 and CB0, respectively, and an output terminal of the logic element ND82 is coupled to an input terminal of the logic element IV84. An output terminal of the logic element IV84 is coupled to an input terminal of the logic element NV84. An input terminal of the logic element NR83 is configured to receive the enable signal EL2, another input terminal of the logic element NR83 is coupled to an output terminal of the logic element NV84, and an output terminal of the logic element NR83 is configured to output the bit line signal B1. An input terminal of the logic element NR84 is configured to receive the enable signal ELB2, another input terminal of the logic element NR84 is coupled to the output terminal of the logic element NV84, and an output terminal of the logic element NR84 is configured to output the bit line signal B5.

As illustratively shown in FIG. 8, two input terminals of the logic element ND83 is configured to receive the clock signal CB1 and C0, respectively, and an output terminal of the logic element ND83 is coupled to an input terminal of the logic element IV85. An output terminal of the logic element IV85 is coupled to an input terminal of the logic element NV85. An input terminal of the logic element NR85 is configured to receive the enable signal EL2, another input terminal of the logic element NR85 is coupled to an output terminal of the logic element NV85, and an output terminal of the logic element NR85 is configured to output the bit line signal B2. An input terminal of the logic element NR86 is configured to receive the enable signal ELB2, another input terminal of the logic element NR86 is coupled to the output terminal of the logic element NV85, and an output terminal of the logic element NR86 is configured to output the bit line signal B6.

As illustratively shown in FIG. 8, two input terminals of the logic element ND84 is configured to receive the clock signal CB1 and CB0, respectively, and an output terminal of the logic element ND84 is coupled to an input terminal of the logic element IV86. An output terminal of the logic element IV86 is coupled to an input terminal of the logic element NV86. An input terminal of the logic element NR87 is configured to receive the enable signal EL2, another input terminal of the logic element NR87 is coupled to an output terminal of the logic element NV86, and an output terminal of the logic element NR87 is configured to output the bit line signal B3. An input terminal of the logic element NR88 is configured to receive the enable signal ELB2, another input terminal of the logic element NR88 is coupled to the output terminal of the logic element NV86, and an output terminal of the logic element NR88 is configured to output the bit line signal B7.

Figure 9:
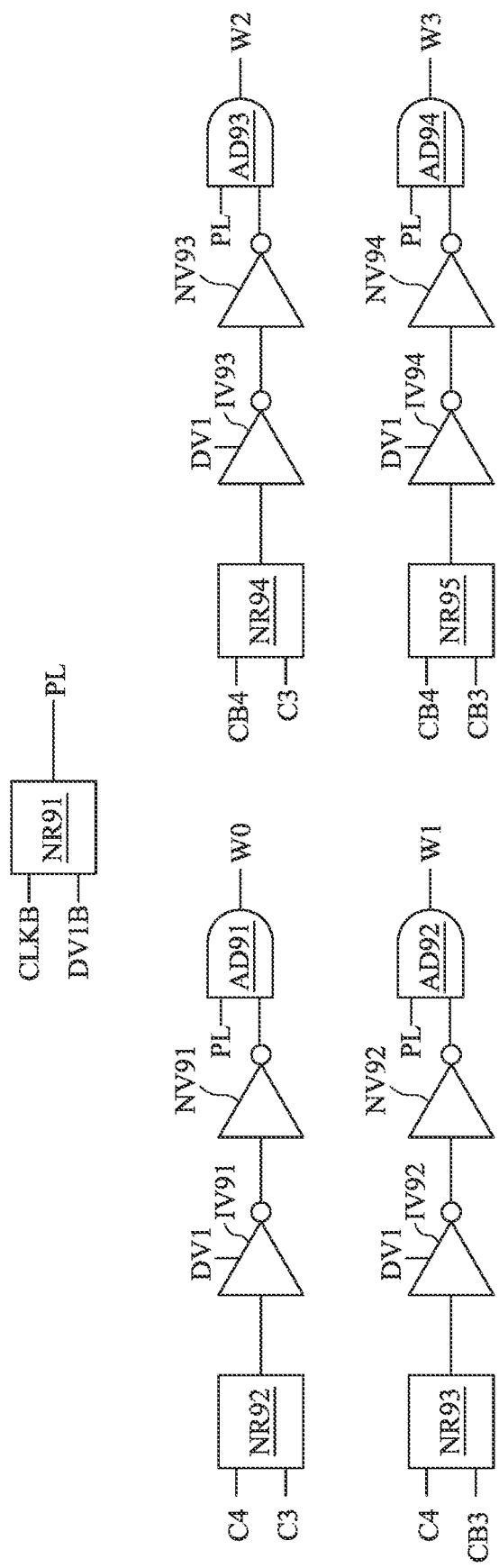
FIG. 9 is a schematic diagram of a logic circuit illustrated according to one embodiment of this disclosure.

FIG. 9 is a schematic diagram of a logic circuit 900 illustrated according to one embodiment of this disclosure. Referring to FIG. 1 and FIG. 9, in some embodiments, the logic circuit 900 is included in the decoding device 150. As illustratively shown in FIG. 9, the logic circuit 900 is configured to generate the pulse signal PL according to clock signals CLKB and DV1B, and configured to generate word line signals W0-W3 according to the pulse signal PL, the clock signals C3-C4 and CB3-CB4. In some embodiments, the clock signals CB3-CB4 are complementary signals of the clock signals C3-C4, respectively.

In some embodiments, the logic circuit 900 includes logic elements AD91-AD94, NR91-NR95, NV91-NV94 and IV91-IV94. In some embodiments, each of the logic elements AD91-AD94 is implemented by an AND logic gate, each of the logic elements NR91-NR95 is implemented by a NOR logic gate, and each of the logic elements NV91-NV94 and IV91-IV94 is implemented by an inverter. In some embodiments, each of the logic elements IV91-IV94 is configured to operate according to the clock signal DV1.

As illustratively shown in FIG. 9, two input terminals of the logic element NR91 is configured to receive the clock signals CLKB and DV1B, respectively, and an output terminal of the logic element NR91 is configured to output the pulse signal PL.

As illustratively shown in FIG. 9, two input terminals of the logic element NR92 is configured to receive the clock signals C3 and C4, respectively, and an output terminal of the logic element NR92 is coupled to an input terminal of the logic element IV91. An output terminal of the logic element IV91 is coupled to an input terminal of the logic element NV91. An input terminal of the logic element AD91 is coupled to an output terminal of the logic element NV91, another input terminal of the logic element AD91 is configured to receive the pulse signal PL, and an output terminal of the logic element AD91 is configured to output the word line signal W0.

As illustratively shown in FIG. 9, two input terminals of the logic element NR93 is configured to receive the clock signals CB3 and C4, respectively, and an output terminal of the logic element NR93 is coupled to an input terminal of the logic element IV92. An output terminal of the logic element IV92 is coupled to an input terminal of the logic element NV92. An input terminal of the logic element AD92 is coupled to an output terminal of the logic element NV92, another input terminal of the logic element AD92 is configured to receive the pulse signal PL, and an output terminal of the logic element AD92 is configured to output the word line signal W1.

As illustratively shown in FIG. 9, two input terminals of the logic element NR94 is configured to receive the clock signals C3 and CB4, respectively, and an output terminal of the logic element NR94 is coupled to an input terminal of the logic element IV93. An output terminal of the logic element IV93 is coupled to an input terminal of the logic element NV93. An input terminal of the logic element AD93 is coupled to an output terminal of the logic element NV93, another input terminal of the logic element AD93 is configured to receive the pulse signal PL, and an output terminal of the logic element AD93 is configured to output the word line signal W2.

As illustratively shown in FIG. 9, two input terminals of the logic element NR95 is configured to receive the clock signals CB3 and CB4, respectively, and an output terminal of the logic element NR95 is coupled to an input terminal of the logic element IV94. An output terminal of the logic element IV94 is coupled to an input terminal of the logic element NV94. An input terminal of the logic element AD94 is coupled to an output terminal of the logic element NV94, another input terminal of the logic element AD94 is configured to receive the pulse signal PL, and an output terminal of the logic element AD94 is configured to output the word line signal W3.

Figure 10:
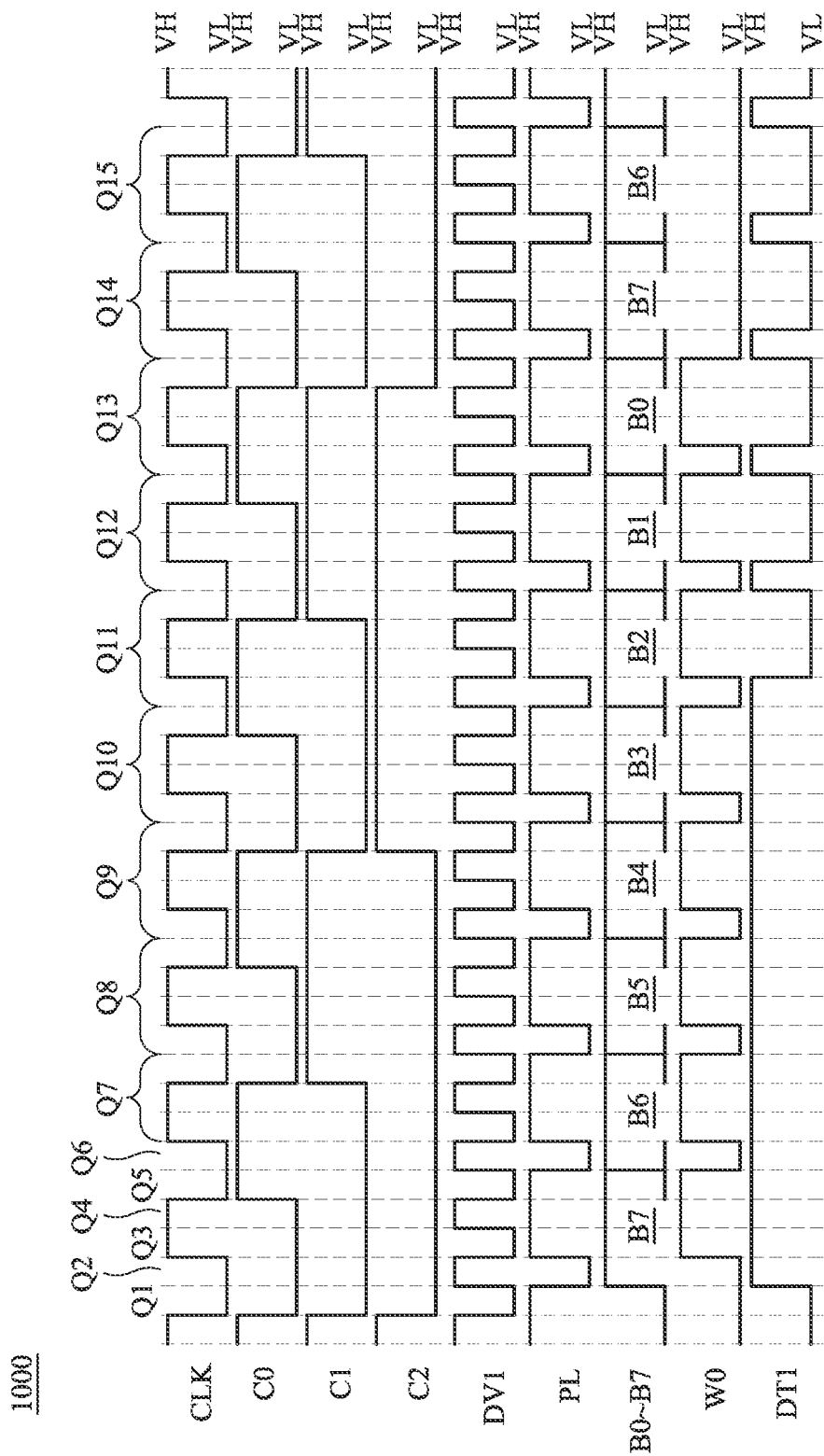
FIG. 10 is a timing diagram of a memory chip generating data signals, illustrated according to one embodiment of this disclosure.

FIG. 10 is a timing diagram 1000 of the memory chip 100 shown in FIG. 1 generating the data signal DT1, illustrated according to one embodiment of this disclosure. As illustratively shown in FIG. 10, the timing diagram 1000 includes periods Q1-Q15 arranged continuously in order. Referring to FIG. 1, FIG. 4 and FIG. 7, in the embodiment shown in FIG. 10, the memory device 170 may be implemented by the memory device 400 and/or the memory device 700, to operate according to the timing diagram 1000.

Referring to FIG. 5 and FIG. 10, the period P53 corresponds to the periods Q1-Q15. In some embodiments, during the periods Q1-Q15, the enable signal ENB0 has the voltage level VL, and the enable signals ENB1-ENB3 has the voltage level VH. Accordingly, referring to FIG. 4, FIG. 5 and FIG. 10, during the periods Q1-Q15, the memory circuit 410 is configured to generate the data signal DT40 at the node N40, and the memory circuits 411-413 are deactivated.

As illustratively shown in FIG. 10, during the period Q1, the clock signals CLK, C0-C2 and DV1 have the voltage level VL, such that the pulse signal PL has the voltage level VH, the bit line signal B7 and the word line signal W0 have the voltage level VL.

Referring to FIG. 10 and FIG. 7, during the period Q1, the switch Z7 is turned off according to the bit line signal B7, the switch X70 is turned off according to the word line signal W0, and the switch T74 is turned off according to the pulse signal PL.

As illustratively shown in FIG. 10, during the period Q2, the clock signals CLK and C0-C2 have the voltage level VL, and the clock signal DV1 has the voltage level VH, such that the pulse signal PL has the voltage level VL, the bit line signal B7 has the voltage level VH, and the word line signal W0 has the voltage level VL.

Referring to FIG. 10 and FIG. 7, during the period Q2, the switch Z7 is turned on according to the bit line signal B7, the switch X70 is turned off according to the word line signal W0, the switch T74 is turned on according to the pulse signal PL, and the switch T73 is turned on according to the enable signal ENB. At this moment, the switches T73 and T74 provide the voltage signal VDD to the node N71 to charge the node N71, such that the data signal DT71 is pulled to the voltage level VH. Accordingly, the data signal DT1 including the data signal DT71 has the voltage level VH. In some embodiments, the period Q2 is referred to as a charging period.

As illustratively shown in FIG. 10, during the period Q3, the clock signals DV1 and C0-C2 have the voltage level VL, and the clock signal CLK has the voltage level VH, such that the pulse signal PL has the voltage level VH, the bit line signal B7 has the voltage level VH, and the word line signal W0 has the voltage level VH.

Referring to FIG. 10 and FIG. 7, during the period Q3, the switch Z7 is turned on according to the bit line signal B7, the switch X70 is turned on according to the word line signal W0, the switch T74 is turned off according to the pulse signal PL, and the switch T73 is turned on according to the enable signal ENB. At this moment, the node N71 is discharged through the switches Z7 and X70 to generate the data signal DT71.

In the embodiment shown in FIG. 10, a bit corresponding to the switches Z7 and X70 has a first logic value, such as a logic value of 1, such that the data signal DT71 has the voltage level VH during the period Q3. Accordingly, the data signal DT1 including information of the data signal DT71 has the voltage level VH.

As illustratively shown in FIG. 10, during the period Q4, the clock signals C0-C2 have the voltage level VL, and the clock signals CLK and DV1 have the voltage level VH, such that the pulse signal PL has the voltage level VH, the bit line signal B7 has the voltage level VH, and the word line signal W0 has the voltage level VH.

Referring to FIG. 10 and FIG. 7, during the period Q4, the switch Z7 is turned on according to the bit line signal B7, the switch X70 is turned on according to the word line signal W0, the switch T74 is turned off according to the pulse signal PL, and the switch T73 is turned on according to the enable signal ENB. At this moment, the node N71 is discharged through the switches Z7 and X70 to generate the data signal DT71.

In the embodiment shown in FIG. 10, the bit corresponding to the switches Z7 and X70 has the first logic value, such that the data signal DT71 has the voltage level VH during the period Q4. Accordingly, the data signal DT1 including information of the data signal DT71 has the voltage level VH.

As illustratively shown in FIG. 10, during the period Q5, the clock signals CLK, C1-C2 and DV1 have the voltage level VL, and the clock signal C0 has the voltage level VH, such that the pulse signal PL has the voltage level VH, the bit line signal B7 has the voltage level VH, and the word line signal W0 has the voltage level VH.

Referring to FIG. 10 and FIG. 7, during the period Q5, the switch Z7 is turned on according to the bit line signal B7, the switch X70 is turned on according to the word line signal W0, the switch T74 is turned off according to the pulse signal PL, and the switch T73 is turned on according to the enable signal ENB. At this moment, the node N71 is discharged through the switches Z7 and X70 to generate the data signal DT71. In some embodiments, the periods Q3-Q5 are referred to as discharging periods.

In the embodiment shown in FIG. 10, the bit corresponding to the switches Z7 and X70 has the first logic value, such that the data signal DT71 has the voltage level VH during the period Q5. Accordingly, the data signal DT1 including information of the data signal DT71 has the voltage level VH.

As illustratively shown in FIG. 10, during the period Q6, the clock signals CLK and C1-C2 have the voltage level VL, and the clock signals C0 and DV1 have the voltage level VH, such that the pulse signal PL, the bit line signal B7 and the word line signal W0 have the voltage level VL, and the bit line signal B6 has the voltage level VH.

Referring to FIG. 10 and FIG. 7, during the period Q6, the switch Z7 is turned off according to the bit line signal B7, the switch Z6 is turned on according to the bit line signal B6, the switch X60 is turned off according to the word line signal W0, the switch T74 is turned on according to the pulse signal PL, and the switch T73 is turned on according to the enable signal ENB. At this moment, the switches T73 and T74 provide the voltage signal VDD to the node N71 to charge the node N71, such that the data signal DT71 is pulled to the voltage level VH. Accordingly, the data signal DT1 including information of the data signal DT71 has the voltage level VH. In some embodiments, the period Q6 is referred to as a charging period.

As illustratively shown in FIG. 10, during the period Q7, the pulse signal PL has the voltage level VH, the bit line signal B6 has the voltage level VH, and the word line signal W0 has the voltage level VH, such that the switch Z6 is turned on according to the bit line signal B6, the switch X60 is turned on according to the word line signal W0, the switch T74 is turned off according to the bit line signal B6, and the switch T73 is turned on according to the enable signal ENB. At this moment, the node N71 is discharged through the switches Z6 and X60 to generate the data signal DT71 and the corresponding data signal DT1.

In some embodiments, operations of the memory device 700 discharging through the switches Z6 and X60 according to the pulse signal PL, the bit line signal B6 and the word line signal W0 during the period Q7, to generate the data signal DT71 are similar with the operations of the memory device 700 discharging through the switches Z7 and X70 according to the pulse signal PL, the bit line signal B7 and the word line signal W0 during the periods Q3-Q5, to generate the data signal DT71. Therefore, some descriptions are not repeated for brevity.

As illustratively shown in FIG. 10, during the period Q8, the bit line signals B6 and B5 have the voltage level VL, and the bit line signal B5 has the voltage level VH. In some embodiments, operations of the memory device 700 charging the node N71 during the period Q8 according to the pulse signal PL, the bit line signal B5 and the word line signal W0, and discharge through the switches Z5 and X50 to generate the data signal DT71 are similar with the operations of the memory device 700 charging the node N71 during the periods Q2-Q5 according to the pulse signal PL, the bit line signal B7 and the word line signal W0, and discharge through the switches Z7 and X70 to generate the data signal DT71. Therefore, some descriptions are not repeated for brevity.

As illustratively shown in FIG. 10, the bit line signals B4-B0 have the voltage level VH during the periods Q9-Q13, respectively. The node N71 is discharged through the switches Z4-Z0 during the periods Q9-Q13, respectively, to generate the data signal DT71. Each of operations of the memory device 700 during the period Q9 corresponding to the bit line signal B4, operations of the memory device 700 during the period Q10 corresponding to the bit line signal B3, operations of the memory device 700 during the period Q11 corresponding to the bit line signal B2, operations of the memory device 700 during the period Q12 corresponding to the bit line signal B1, and operations of the memory device 700 during the period Q13 corresponding to the bit line signal B0 is similar with the operations of the memory device 700 during the periods Q2-Q5 corresponding to the bit line signal B7. Therefore, some descriptions are not repeated for brevity.

In the embodiment shown in FIG. 10, during the periods Q11-Q13, the bits correspond to the switches X20, X10 and X00 have a second logic value, such as a logic value of 0, such that the data signal DT1 has the voltage level VL during the period Q11-Q13, when the word line signal W0 has the voltage level VH.

Referring to FIG. 10 and FIG. 7, during the periods Q1-Q13, the switches X70, X60, X50, X40, X30, X20, X10 and X00 configured to receive the word line signal W0 generate the data signal DT71 in order. In the embodiment shown in FIG. 10, the logic values of eight bits corresponding to the switches X70, X60, X50, X40, X30, X20, X10 and X00 are 1, 1, 1, 1, 1, 0, 0 and 0 in order.

As illustratively shown in FIG. 10, during the period Q14, the word line signal W0 has the voltage level VL, and the word line signal W1 (not shown in FIG. 10) and the bit line signal B7 have the voltage level VH. Referring to FIG. 10 and FIG. 7, during the period Q14, the switch Z7 is turned on according to the bit line signal B7, and the switch X71 is turned on according to the word line signal W1. At this moment, the node N71 is discharged through the switches Z7 and X71 to generate the data signal DT71.

As illustratively shown in FIG. 10, during the period Q15, the word line signal W0 has the voltage level VL, and the word line signal W1 (not shown in FIG. 10) and the bit line signal B6 have the voltage level VH. Referring to FIG. 10 and FIG. 7, during the period Q15, the switch Z6 is turned on according to the bit line signal B6, and the switch X61 is turned on according to the word line signal W1. At this moment, the node N71 is discharged through the switches Z6 and X61 to generate the data signal DT71.

In some embodiments, each of operations of the memory device 700 during the period Q14 corresponding to the bit line signal B7 and the word line signal W1, and operations of the memory device 700 during the period Q15 corresponding to the bit line signal B6 and the word line signal W1 is similar with the operations of the memory device 700 during the periods Q2-Q5 corresponding to the bit line signal B7 and the word line signal W1. Therefore, some descriptions are not repeated for brevity.

In some embodiments, a time length of the periods Q1-Q4 is approximately equal to 1/106000 second. In some embodiments, a frequency of the clock signal DV1 is approximately equal to two hundred and twelve kHz.

Figure 11:
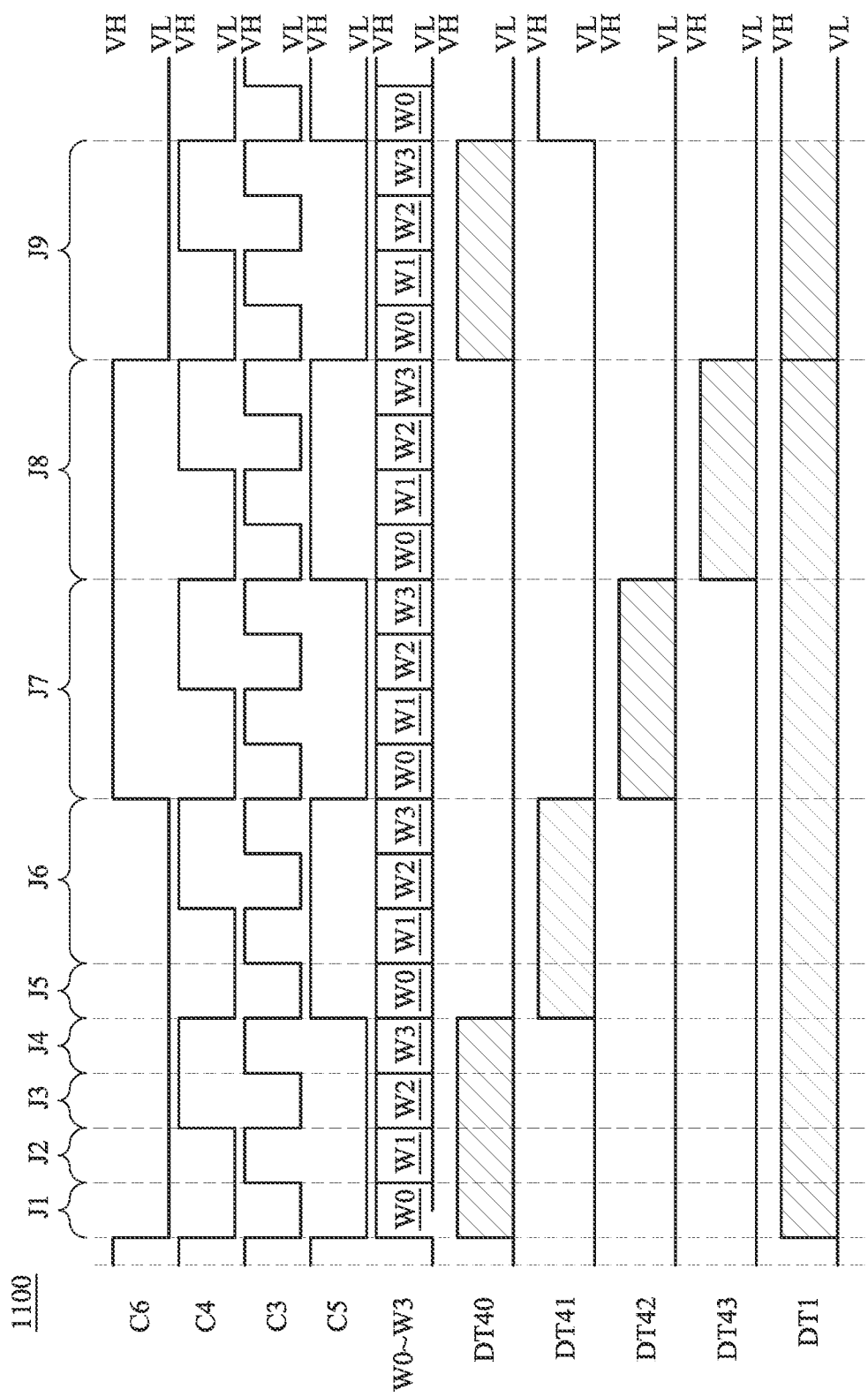
FIG. 11 is a timing diagram of a memory chip generating data signals, illustrated according to one embodiment of this disclosure.

FIG. 11 is a timing diagram 1100 of the memory chip 100 shown in FIG. 1 generating the data signal DT1, illustrated according to one embodiment of this disclosure. As illustratively shown in FIG. 11, the timing diagram 1100 includes periods J1-J9 arranged continuously in order. Referring to FIG. 1, FIG. 4, FIG. 6B, in the embodiment shown in FIG. 11, the memory device 170 may be implemented by the memory device 400 and or the memory device 700, and may include the logic circuit 600B, to operate according to the timing diagram 1100.

As illustratively shown in FIG. 11, during the period J1, the clock signals C3-C6 have the voltage level VL, such that the word line signal W0 and the enable signals ENB1-ENB3 have the voltage level VH, and the word line signals W1-W3 and the enable signal ENB0 have the voltage level VL.

Referring to FIG. 11 and FIG. 7, the switches X00, X10, X20, X30, X40, X50, X60 and X70 are turned on according to the word line signal W0, such that the memory device 700 generates the data signal DT71 corresponding to the bits of the switches X00, X10, X20, X30, X40, X50, X60 and X70.

Similarly, referring to FIG. 11 and FIG. 4, during the period J1, the controlling circuit 420 is configured to activate the memory circuit 410 according to the enable signal ENB0, such that the memory circuit 410 generates the data signal DT40 corresponding to the word line signal W0. At this moment, the controlling circuits 421-423 are configured to deactivate the memory circuits 411-413, such that the nodes N41-N43 have the voltage level VL.

As illustratively shown in FIG. 11, during the period J2, the clock signals C4-C6 have the voltage level VL, the clock signal C3 has the voltage level VH, such that the word line signal W1 and the enable signals ENB1-ENB3 have the voltage level VH, and the word line signals W0, W2-W3 and the enable signal ENB0 have the voltage level VL.

Referring to FIG. 11 and FIG. 7, during the period J2, the switches X01, X11, X21, X31, X41, X51, X61 and X71 are turned on according to the word line signal W1, such that the memory device 700 generates the data signal DT71 corresponding to the bits of the switches X01, X11, X21, X31, X41, X51, X61 and X71.

Similarly, referring to FIG. 11 and FIG. 4, during the period J2, the controlling circuit 420 is configured to activate the memory circuit 410 according to the enable signal ENB0, such that the memory circuit 410 generates the data signal DT40 corresponding to the word line signal W1. At this moment, the controlling circuits 421-423 are configured to deactivate the memory circuits 411-413, such that the nodes N41-N43 have the voltage level VL.

Referring to FIG. 11 and FIG. 10, the period J1 corresponds to the periods Q1-Q13, and the period J2 corresponds to the periods Q14-Q15. In some embodiments, the memory circuit is configured to operate according to the word line signal W0 during the periods J1 and Q1-Q13, and operate according to the word line signal W1 during the periods J2 and Q14-Q15.

In some embodiments, a time length of the period J1 is approximately equal to a time length of the periods Q1-Q13. As illustratively shown in FIG. 11 and FIG. 10, a frequency of the clock signal DV1 is approximately equal to twice of a frequency of the clock signal CLK, the frequency of the clock signal CLK is approximately equal to twice of a frequency of the clock signal C0, the frequency of the clock signal CLK is approximately equal to twice of a frequency of the clock signal C0, the frequency of the clock signal C0 is approximately equal to twice of a frequency of the clock signal C1, the frequency of the clock signal C1 is approximately equal to twice of a frequency of the clock signal C2, the frequency of the clock signal C2 is approximately equal to twice of a frequency of the clock signal C3, the frequency of the clock signal C3 is approximately equal to twice of a frequency of the clock signal C4, the frequency of the clock signal C4 is approximately equal to twice of a frequency of the clock signal C5, and the frequency of the clock signal C5 is approximately equal to twice of a frequency of the clock signal C6.

As illustratively shown in FIG. 11, during the period J3, the clock signals C3, C5-C6 have the voltage level VL, the clock signal C4 has the voltage level VH, such that the word line signal W2 and the enable signals ENB1-ENB3 have the voltage level VH, and the word line signals W0, W1, W3 and the enable signal ENB0 have the voltage level VL.

Referring to FIG. 11 and FIG. 7, during the period J3, the switches X02, X12, X22, X32, X42, X52, X62 and X72 are turned on according to the word line signal W2, such that the memory device 700 generates the data signal DT71 corresponding to the bits of the switches X02, X12, X22, X32, X42, X52, X62 and X72.

Similarly, referring to FIG. 11 and FIG. 4, during the period J3, the controlling circuit 420 is configured to activate the memory circuit 410 according to the enable signal ENB0, such that the memory circuit 410 generates the data signal DT40 corresponding to the word line signal W2. At this moment, the controlling circuits 421-423 are configured to deactivate the memory circuits 411-413, such that the nodes N41-N43 have the voltage level VL.

As illustratively shown in FIG. 11, during the period J4, the clock signals C5-C6 have the voltage level VL, the clock signals C3 and C4 have the voltage level VH, such that the word line signal W3 and the enable signals ENB1-ENB3 have the voltage level VH, and the word line signals W0, W1, W2 and the enable signal ENB0 have the voltage level VL.

Referring to FIG. 11 and FIG. 7, during the period J4, the switches X03, X13, X23, X33, X43, X53, X63 and X73 are turned on according to the word line signal W3, such that the memory device 700 generates the data signal DT71 corresponding to the bits of the switches X03, X13, X23, X33, X43, X53, X63 and X73.

Similarly, referring to FIG. 11 and FIG. 4, during the period J4, the controlling circuit 420 is configured to activate the memory circuit 410 according to the enable signal ENB0, such that the memory circuit 410 generates the data signal DT40 corresponding to the word line signal W3. At this moment, the controlling circuits 421-423 are configured to deactivate the memory circuits 411-413, such that the nodes N41-N43 have the voltage level VL.

As illustratively shown in FIG. 11, during the period J5, the clock signals C3, C4 and C6 have the voltage level VL, the clock signal C5 has the voltage level VH, such that the word line signal W0 and the enable signals ENB0, ENB2 and ENB3 have the voltage level VH, and the word line signals W3, W1, W2 and the enable signal ENB1 have the voltage level VL.

Referring to FIG. 11 and FIG. 7, during the period J5, the switches X00, X10, X20, X30, X40, X50, X60 and X70 are turned on according to the word line signal W0, such that the memory device 700 generates the data signal DT71 corresponding to the bits of the switches X00, X10, X20, X30, X40, X50, X60 and X70.

Similarly, referring to FIG. 11 and FIG. 4, during the period J5, the controlling circuit 421 is configured to activate the memory circuit 411 according to the enable signal ENB1, such that the memory circuit 411 generates the data signal DT41 corresponding to the word line signal W0. At this moment, the controlling circuits 420, 422 and 423 are configured to deactivate the memory circuits 410, 412 and 413 according to the enable signals ENB0, ENB2 and ENB3, such that the nodes N40, N42 and N43 have the voltage level VL.

During the period J6, the enable signal ENB1 has the voltage level VL, the memory circuit 411 generates the data signal DT41 corresponding to the word line signals W1-W3 in order. Operations of the memory circuit 411 generating the data signal DT41 according to the enable signal ENB1 and the word line signals W1-W3 during the period J6 are similar with the operations of the memory circuit 410 generating the data signal DT40 according to the enable signal ENB0 and the word line signals W1-W3 during the periods J2-J4. Therefore, some descriptions are not repeated for brevity.

During the period J7, the enable signal ENB2 has the voltage level VL, the memory circuit 412 generates the data signal DT42 corresponding to the word line signals W0-W3 in order. Operations of the memory circuit 412 generating the data signal DT42 according to the enable signal ENB2 and the word line signals W0-W3 during the period J7 are similar with the operations of the memory circuit 410 generating the data signal DT40 according to the enable signal ENB0 and the word line signals W0-W3 during the periods J1-J4. Therefore, some descriptions are not repeated for brevity.

During the period J8, the enable signal ENB3 has the voltage level VL, the memory circuit 413 generates the data signal DT43 corresponding to the word line signals W0-W3 in order. Operations of the memory circuit 413 generating the data signal DT43 according to the enable signal ENB3 and the word line signals W0-W3 during the period J8 are similar with the operations of the memory circuit 410 generating the data signal DT40 according to the enable signal ENB0 and the word line signals W0-W3 during the periods J1-J4. Therefore, some descriptions are not repeated for brevity.

During the period J9, the enable signal ENB0 has the voltage level VL, the memory circuit 410 generates the data signal DT40 corresponding to the word line signals W0-W3 in order. Operations of the memory circuit 410 generating the data signal DT41 according to the enable signal ENB0 and the word line signals W0-W3 during the period J9 are similar with the operations of the memory circuit 410 generating the data signal DT40 according to the enable signal ENB0 and the word line signals W0-W3 during the periods J1-J4. Therefore, some descriptions are not repeated for brevity.

Referring to FIG. 11 and FIG. 5, the periods J1-J4 correspond to the period P53, the periods J5-J6 correspond to the period P54, the period J7 corresponds to the period P55, the period J8 corresponds to the period P56, the period J9 correspond to the period P57.

As illustratively shown in FIG. 11, during the periods J1-J8, the memory circuits 410-413 are configured to generate the data signals DT40-DT43 in order. Referring to FIG. 11 and FIG. 6B, during the periods J1-J8, the logic circuit 600B is configured to combine the data signals DT41-DT43 together to generate the data signal DT1.

The controlling timing and the circuit configurations described above in present disclosure are for illustration purpose. Other controlling timing and circuit configurations are contemplated as being within the scope of the present disclosure.

In summary, in some embodiments of the present disclosure, the memory chip 100 controls the memory device 170 according to the clock signals C0-C6, such that the memory circuits 410-413 in the memory device 170 generate data signals DT40-DT43 according to the same word line signals W0-W3 in order. As a result, a required current of the memory device 170 is lower, and a required area of the decoding device 150 generating the word line signals W0-W3 is smaller. In some embodiments, the memory device 170 is suitable for low temperature poly silicon processes.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory chip, comprising a memory device, the memory device comprising:
   a first memory circuit configured to output a first data signal at a first node;
   a first controlling circuit, comprising:
      a first switch, a control terminal of the first switch being configured to receive a first enable signal, a first terminal of the first switch coupled to the first node;
      a second switch, a control terminal of the second switch being configured to receive a pulse signal, a first terminal of the second switch coupled to the first node; and
      a third switch, a control terminal of the third switch being configured to receive the first enable signal, a first terminal of the third switch coupled to a second terminal of the second switch;
   a second memory circuit configured to output a second data signal at a second node;
   a second controlling circuit, comprising:
      a fourth switch, a control terminal of the fourth switch being configured to receive a second enable signal, a first terminal of the fourth switch coupled to the second node;
      a fifth switch, a control terminal of the fifth switch being configured to receive the pulse signal, a first terminal of the fifth switch coupled to the second node; and
      a sixth switch, a control terminal of the sixth switch being configured to receive the second enable signal, a first terminal of the sixth switch coupled to a second terminal of the fifth switch; and
   a first logic circuit configured to perform a first logic operation to generate the first enable signal according to a first clock signal and a second clock signal, wherein a frequency of the second clock signal is approximately twice of a frequency of the first clock signal.

2. The memory chip of claim 1, wherein
the first logic circuit is further configured to perform a second logic operation to generate the second enable signal according to the first clock signal and a complementary signal of the second clock signal.

3. The memory chip of claim 2, wherein the memory device further comprises:
   a second logic circuit configured to perform a third logic operation to generate the pulse signal according to a third clock signal and a fourth clock signal,
   wherein a frequency of the fourth clock signal is approximately twice of a frequency of the third clock signal.

4. The memory chip of claim 3, wherein the frequency of the third clock signal is approximately sixty-four times of the frequency of the second clock signal.

5. The memory chip of claim 1, wherein the first memory circuit comprises:
   a seventh switch, a first terminal of the seventh switch coupled to the first node; and
   an eighth switch, a first terminal of the eighth switch coupled to a second terminal of the seventh switch.

6. The memory chip of claim 5, wherein a type of the second switch, the third switch, the fifth switch and the sixth switch is different from a type of the first switch, the fourth switch, the seventh switch and the eighth switch.

7. The memory chip of claim 6, wherein
the second memory circuit is further configured to generate the second data signal at least according to a word line signal and a bit line signal,
a control terminal of the seventh switch is configured to receive the bit line signal, and
a control terminal of the eighth switch is configured to receive the word line signal.

8. The memory chip of claim 1, wherein the memory device further comprises:
   a third memory circuit configured to output a third data signal at a third node; and a third controlling circuit, comprising:
- a seventh switch, a control terminal of the seventh switch being configured to receive a third enable signal, a first terminal of the seventh switch coupled to the third node; and
- an eighth switch, a control terminal of the eighth switch being configured to receive the pulse signal, a first terminal of the eighth switch coupled to the third node.

9. The memory chip of claim 8, wherein the third controlling circuit further comprises:
- a ninth switch, a control terminal of the ninth switch being configured to receive the third enable signal, a first terminal of the ninth switch coupled to a second terminal of the eighth switch.

10. The memory chip of claim 9, wherein the memory device further comprises:
- a fourth memory circuit configured to output a fourth data signal at a fourth node; and
- a fourth controlling circuit, comprising:
  - a tenth switch, a control terminal of the tenth switch being configured to receive a fourth enable signal, a first terminal of the tenth switch coupled to the fourth node; and
  - an eleventh switch, a control terminal of the eleventh switch being configured to receive the pulse signal, a first terminal of the eleventh switch coupled to the fourth node.

11. The memory chip of claim 10, wherein the fourth controlling circuit further comprises:
- a twelfth switch, a control terminal of the twelfth switch being configured to receive the fourth enable signal, a first terminal of the twelfth switch coupled to a second terminal of the eleventh switch.

* * * * *